United States Patent [19] [11] Patent Number: 5,024,963
Park et al. [45] Date of Patent: Jun. 18, 1991

[54] METHOD OF FABRICATING A BCCD CHANNEL WITH STAIR-CASE DOPING BY SELF-ALIGNMENT

[75] Inventors: Yong Park, Anyang; Seo K. Lee, Seongnam, both of Rep. of Korea

[73] Assignee: Goldstar Electron Co., Cheongji, Rep. of Korea

[21] Appl. No.: 553,170

[22] Filed: Jul. 16, 1990

[30] Foreign Application Priority Data

Jan. 29, 1990 [KR] Rep. of Korea .................. 948/1990

[51] Int. Cl.⁵ .......................................... H01L 21/263
[52] U.S. Cl. .......................................... 437/41; 437/53
[58] Field of Search ........................... 437/53, 41

[56] References Cited

U.S. PATENT DOCUMENTS 4,362,575 12/1982 Wallace .................................. 437/53
4,396,438 8/1983 Goodman ............................. 437/53
4,642,877 2/1987 Garner et al. ........................ 437/53
4,728,622 3/1988 Kamata ................................. 437/53

Primary Examiner—Brian E. Hearn
Assistant Examiner—Gordon V. Hugo
Attorney, Agent, or Firm—Blakely, Sokoloff, Taylor & Zafman

[57] ABSTRACT

This invention relates to a method of forming a charge coupled device (CCD) channel which has a trench-type multi-potential profile. To form the multi-potential profile, ion implantation is performed several times with a self-alignment mask using a polysilicon layer. This method simplifies the fabrication process and prevents charges from diffusing over the entire CCD channel laterally when the amount of charge is small. This results in charge confinement in a trench in the middle of the channel, enhancing self-induced field and fringing field. Consequently, charge transfer efficiency is improved for small amount of charge.

5 Claims, 3 Drawing Sheets

METHOD OF FABRICATING A BCCD CHANNEL WITH STAIR-CASE DOPING BY SELF-ALIGNMENT

BACKGROUND OF INVENTION

1. Field of the Invention

This invention relates to a fabricating method for charge coupled device (CCD) channel by self-alignment, particularly to the method for fabricating the CCD channel which an enhancement of charge transfer efficiency can be obtained in case that small amount of charge exist in a CCD channel.

2. Description of Related Art

FIGS. 1A-1C show the configuration of a conventional CCD channel. As shown in these figures, the CCD channel consists of first polysilicon gates(2 and 2a) and second polysilicon gates(5 and 5a) which are placed alternatively. With this scheme, two-phase clock is necessary for the charge transfer.

However, conventional CCD channel structures have a critical shortcoming which is a poor charge transfer efficiency when a small amount of charge exists in the channel. This is because conventional CCD channels are laterally too wide for small amount charge which diffuse over the channel as shown in FIG. 1C, reducing self-induced field and fringing field. Consequently, charge transfer efficiency becomes degraded.

OBJECT OF INVENTION

The object of this invention is to provide a fabricating method which overcomes the shortcoming of the conventional art described above.

SUMMARY OF INVENTION

To prevent small amount of charge from diffusing over the channel, a trench-type potential is formed in the middle of the channel only under second polysilicon gates 5 as shown in FIGS. 2A and B. Then, the charges become confined in small volume, consequently, efficient charge transfer is possible.

BRIEF DESCRIPTION OF THE DRAWINGS

FIG. 1A is a top-view;

FIG. 1B is a configuration and a potential profile in the direction of A—A in FIG. 1A;

FIG. 1C is a cross sectional view in the direction of B—B in FIG. 1A;

FIG. 2A is a configuration and a potential profile in the direcion of A—A in FIG. 1A;

FIG. 2B is a cross sectionasl view in the direction of B—B in FIG. 1A; and

DETAILED DESCRIPTION OF THIS INVENTION

Figure 1A:
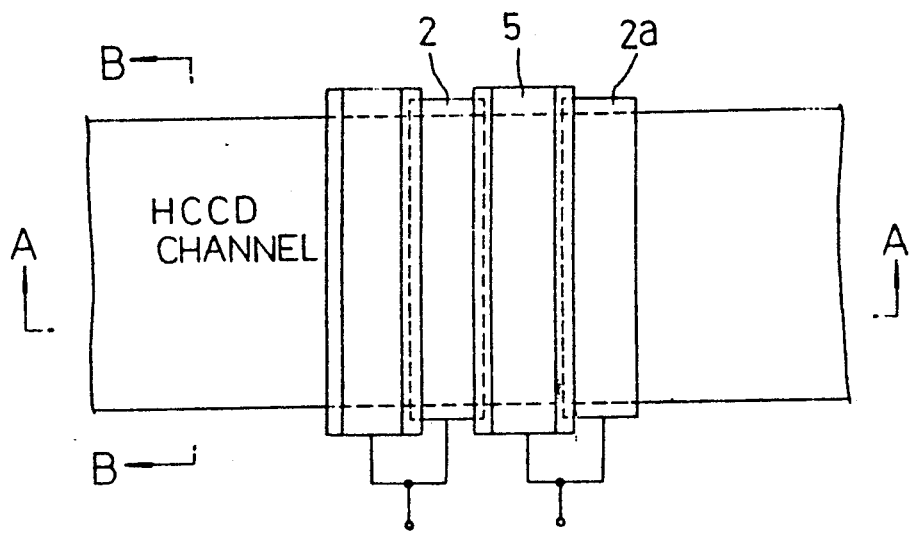
FIGS 1A-1C show the configurations of a conventional CCD channel.
Figure 1B:
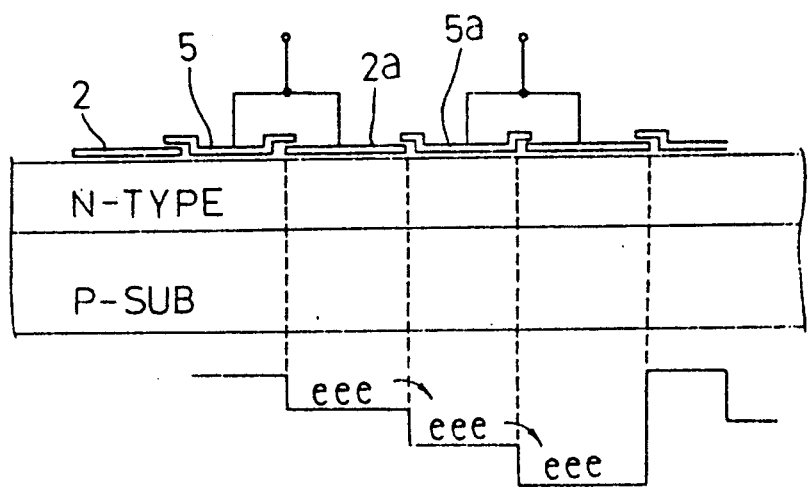
Figure 1C:
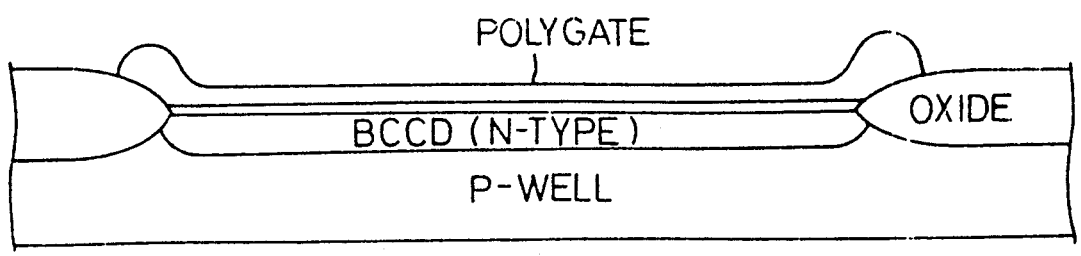
Figure 2A:
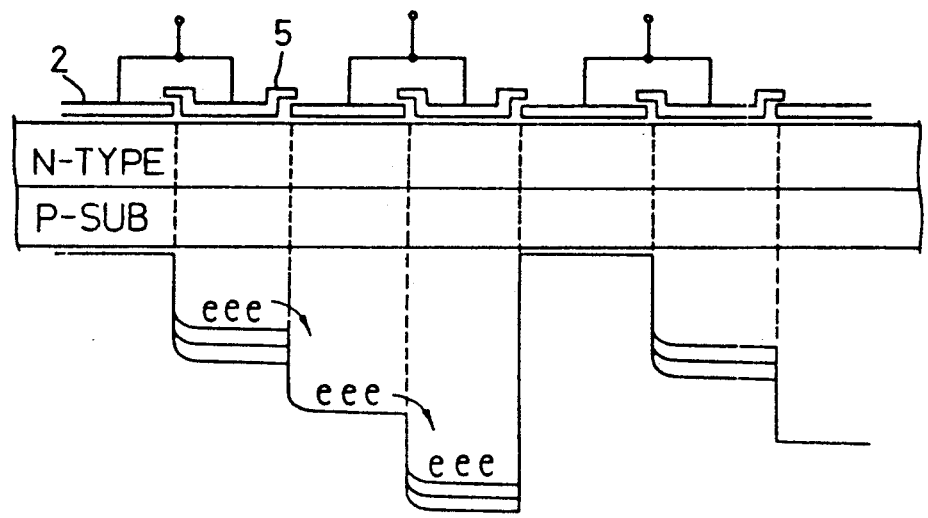
FIG. 2A-2B show the configurations of the present invention.
Figure 2B:
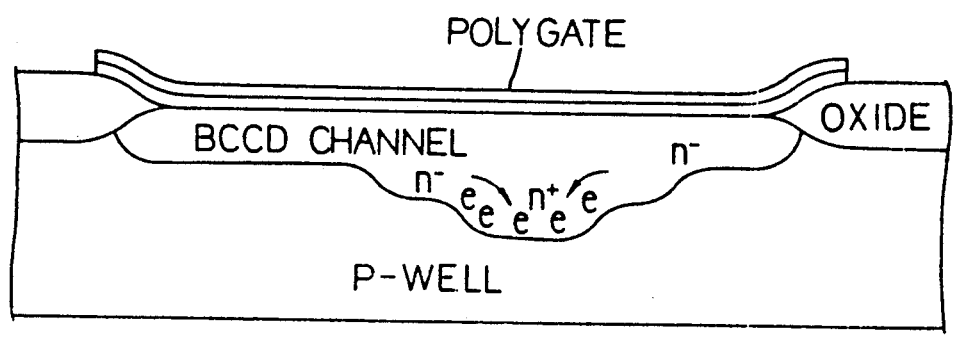

FIGS. 3A-3E show a procedure of the fabricating process for the device structure whose potential profile looks like FIG. 2B. Detailed description of the procedure is as follows.

Figure 3A:
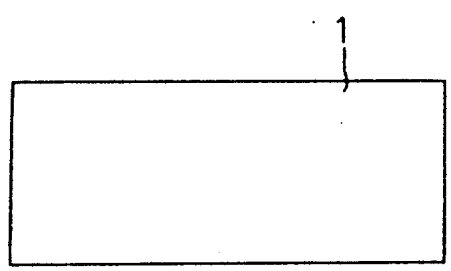
FIGS. 3A-3E show a procedure of fabricating process of a CCD channel by self-alignment according to the present invention.
Figure 3B:
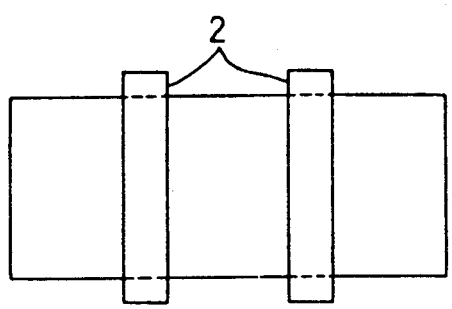
Figure 3C:
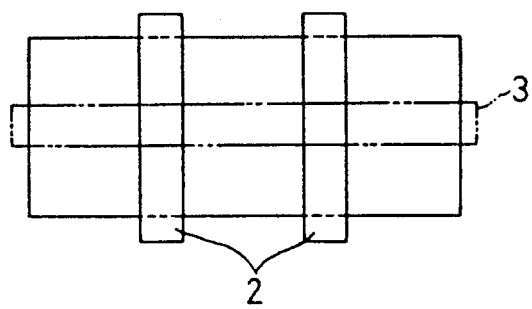
Figure 3D:
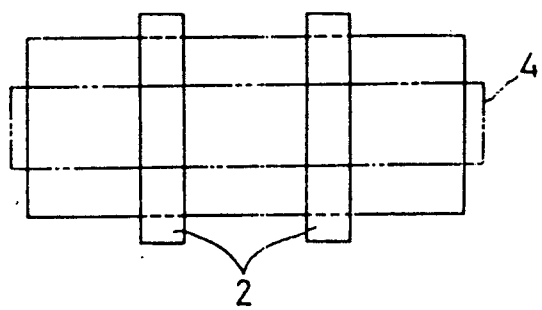
Figure 3E:
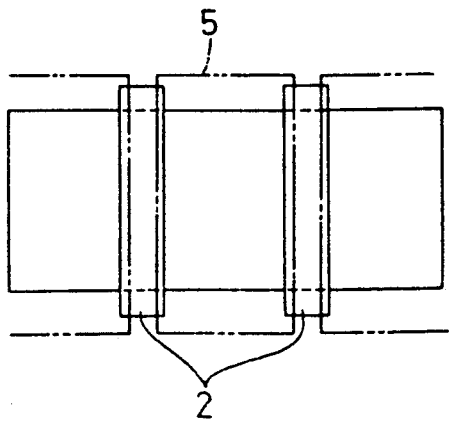

Firstly, ion implantation is performed over the entire active areas 1 as shown in FIG. 3A. Then, polysilicon is deposited and etched out partially to have first polysilicon gate 2 of FIG. 3B. Nextly, photoresist (PR) process is performed, i.e., PR is deposited and developed to have the opening 3 in FIG. 3C. Then, second ion implantation (I/I) is performed. In this case, first polysilicon gate 2 plays a role of a mask for the I/I. Thus, self-alignment is accomplished. Another PR process is followed to have the opening 4 in FIG. 3D, and the third I/I is performed. Also in this case, first polysilicon gate 2 is used as a self-alignment mask for I/I. If we need more steps in the potential profile, PR process and I/I process can be repeated. Finally, polysilicon is deposited and etched out to have second polysilicon gate 5 as shown in FIG. 3E.

Performing above procedure, a trench-type multi-potential profile can be obtained as shown in FIG. 2B and small amount of charge can be confined in the trench which is a lower potential level. Therefore, charges confined in the area of second polysilicon gate 5 in FIG. 3E result in enhancements of self-induced field and fringing field which are beneficial to the charge transfer in a CCD channel.

Aforementioned scheme will be very useful in an application of high-fidelity and high-resolution camcorder, where efficient charge transfer is necessasry.

What is claimed is:

1. A fabricating method for a CCD channel by self-alignment comprising the following steps of:
    performing ion implantation in a selected active area of a semiconductor substrate;
    depositing a first polysilicon layer on said active area;
    etching out a selected area of said first polysilicon layer to create a first polysilicon gate;
    depositing a layer of PR having an opening overlying a portion of said first polysilicon gate;
    performing a second ion implantation using said first polysilicon gate as a mask to provide self-alignment;
    forming another PR layer having an opening larger than and overlying said first opening;
    performing a third ion implantation using said first polysilicon gate as a mask to provide self-alignment;
    depositing a second layer of polysilicon atop said selected active area; and
    etching out a selected area of said second layer of polysilicon to provide a second polysilicon gate over a portion of said active area adjacent to said first polysilicon gate.

2. A method according to claim 1, wherein the impurity concentration of said selected active area not beneath either of said first or second silicon gates is lower than that of the active area beneath said first polysilicon gate and that of the selected active area beneath said first polysilicon gate is lower than said portion of said active area beneath said second polysilicon gate.

3. A method according to claim 1, wherein the resulting potential profile has the shape of a staircase in the longitudinal direction along the channel which includes a multi-potential profile under said second polysilicon gate.

4. A method according to claim 3, wherein additional PR process and ion implantation are included to create additional steps in said multi-potential profile.

5. A method according to claim 1, wherein a trench-type, multi-potential doping profile is formed in the middle of the region under said second polysilicon gate.

* * * * *

UNITED STATES PATENT AND TRADEMARK OFFICE
CERTIFICATE OF CORRECTION

PATENT NO. : 5,024,963
DATED : 06/18/91
INVENTOR(S) : Park et al.

It is certified that error appears in the above-identified patent and that said Letters Patent is hereby corrected as shown below:

col. 01, line 55    delete "sectionasl"    insert --sectional--
col. 01, line 68    delete "areas"         insert --area--

Signed and Sealed this

Ninth Day of November, 1993

Attest:

BRUCE LEHMAN

Attesting Officer    Commissioner of Patents and Trademarks